United States Patent
Kyung

(10) Patent No.: US 7,093,076 B2
(45) Date of Patent: Aug. 15, 2006

(54) MEMORY SYSTEM HAVING TWO-WAY RING TOPOLOGY AND MEMORY DEVICE AND MEMORY MODULE FOR RING-TOPOLOGY MEMORY SYSTEM

(75) Inventor: Kye-Hyun Kyung, Youngin (KR)

(73) Assignee: Samsung Electronics, Co., Ltd., (KR)

( * ) Notice: Subject to any disclaimer, the term of this patent is extended or adjusted under 35 U.S.C. 154(b) by 288 days.

(21) Appl. No.: 10/347,733

(22) Filed: Jan. 21, 2003

(65) Prior Publication Data
US 2004/0117569 A1 Jun. 17, 2004

Related U.S. Application Data

(60) Provisional application No. 60/432,816, filed on Dec. 12, 2002.

(51) Int. Cl.
*G06F 12/00* (2006.01)
(52) U.S. Cl. .................. 711/133; 711/172; 710/100; 365/51
(58) Field of Classification Search ................ 711/154; 710/20
See application file for complete search history.

(56) References Cited

U.S. PATENT DOCUMENTS

| | | | | |
|---|---|---|---|---|
| 5,546,023 A | 8/1996 | Borkar et al. | .................. | 326/93 |
| 5,574,931 A | 11/1996 | Letellier et al. | .............. | 395/800 |
| 6,317,352 B1 | 11/2001 | Halbert et al. | ................ | 365/52 |
| 6,377,582 B1* | 4/2002 | Neiger | ........................ | 370/406 |
| 6,425,020 B1* | 7/2002 | Sharma | ........................ | 710/20 |
| 6,658,509 B1* | 12/2003 | Bonella et al. | ............. | 710/100 |
| 6,742,098 B1* | 5/2004 | Halbert et al. | ............... | 711/172 |
| 6,747,887 B1* | 6/2004 | Halbert et al. | ................ | 365/51 |
| 2002/0038405 A1 | 3/2002 | Leddige et al. | ............. | 711/115 |

FOREIGN PATENT DOCUMENTS

WO    WO 02/23353    3/2002

* cited by examiner

*Primary Examiner*—Mano Padmanabhan
*Assistant Examiner*—Duc T Doan
(74) *Attorney, Agent, or Firm*—Mills & Onello LLP

(57) ABSTRACT

A memory system, memory module and memory device are described. The memory system includes a plurality of the memory modules connected in a series configuration on a first signal path. The first signal path and a second signal path carry memory control and data signals between the memory modules and a memory controller. The memory controller transmits and receives the control signals and data signals on the first and second signal paths. The first and second signal paths are connected together such that the memory modules are connected in a ring configuration. The control signals and data signals travel in opposite directions on the first and second signal paths. The first and second signal paths are shared by both the data signals and the control signals. The memory modules include multi-functional ports, each of which can receive both the control signals and the data signals and output the signals onto the connected signal paths. The memory device in accordance with the invention can include multi-functional conductors or pins which can both receive and output both the control signals and the data signals.

17 Claims, 7 Drawing Sheets

MEMORY SYSTEM HAVING TWO-WAY RING TOPOLOGY AND MEMORY DEVICE AND MEMORY MODULE FOR RING-TOPOLOGY MEMORY SYSTEM

RELATED APPLICATIONS

This application is based on U.S. Provisional Patent Application No. 60/432,816, filed on Dec. 12, 2002, the contents of which are incorporated herein in their entirety by reference.

FIELD OF THE INVENTION

The present invention relates to memory systems in computer systems. More particularly, the present invention relates to a daisy-chained ring topology memory system having signal lines which can be used as either data signal lines or control (CA) signal lines.

BACKGROUND OF THE INVENTION

A variety of bus topologies capable of reducing signal distortion have been developed. One of these topologies includes a point-to-point connection. The memory module for a point-to-point connection typically has two ports. One of the ports is used exclusively as an input port, and the other port is used exclusively as an output port. This configuration increases the pin count and, therefore, the size and complexity, of the memory module.

SUMMARY OF THE INVENTION

The invention is directed to a memory system, a memory module, and a memory device which solve the problems of the prior art. The memory system of the invention includes a signal path shared by memory control signals, referred to herein as CA signals, and data signals. A memory controller transmits the CA signals at a first end of the signal path and bi-directionally transmits the data signals at a second end of the data path. A plurality of memory modules and the memory controller are connected by the signal path in a closed-loop configuration.

The memory module in accordance with the invention includes at least one memory circuit or device for storing data. The module also includes first and second ports. The first port is an input and output port for the data signals and the CA signals, respectively. The second port is an input port and output port for the CA signals and the data signals, respectively.

The memory device of the invention includes a memory circuit or device for storing data. The device also includes first and second ports. The first port is an input and output port for the data signals and the CA signals, respectively. The second port is an input port and output port for the CA signals and the data signals, respectively. A buffer circuit provides an interface between the memory circuit or device and the first and second ports.

The signal path can comprise a plurality of signal lines. M refers to the quantity of CA signals, and N refers to the quantity of data signals. The quantity of signal lines in the data path is the greater of M and N, that is, the quantity of signal lines is M if M is greater than N, and the quantity of signal lines is N if N is greater than M.

The CA signals can be output by the first port of the memory controller on the signal path, and the data signals can be bi-directionally transmitted by the second port of the memory controller on the signal path. One of the CA signals and the data signals can by output by the first port of the memory controller at the first end of the signal path, and the other of the data signals and the CA signals can be output by the second port of the memory controller at the second end of the signal path.

The memory module of the invention can include ports for receiving the CA signals and the data signals. The ports can be multi-functional ports which can be used to output the CA signals and receive the data signals or to output the data signals and receive the CA signals. In one embodiment, a first port of a memory module is an input port and a an output port for the data signals and the CA signals, respectively. The second port of the memory module can be an input port and a an output port for the CA signals and the data signals, respectively.

In one embodiment, the memory module includes a destination circuit for determining whether a received signal is intended to be received by the memory module. Each memory module can include an output buffer for outputting a received signal to the signals path if it is determined that the received signal is not intended to be received by the memory module. The destination circuit can also receive the received signal. That is, the signal can pass through one of the ports to the destination circuit.

The destination circuit can also determine whether a received signal is a CA signal or a data signal. The destination circuit can then generate a signal mode signal, which is indicative of whether the received signal is a data signal or a CA signal. Each memory module can also include a router circuit for routing a received signal that has been identified as a data signal to a memory circuit or device of the memory module on a data signal line. The routing circuit can also route a received signal identified as a CA signal to the memory signal on a CA signal line.

In one embodiment, the memory module includes a synchronization circuit for compensating for delay in propagation of a received signal on the signal path.

The memory module can also include an output buffer for outputting a received signal if it is determined that the received signal is not intended to be received by the memory module.

In accordance with the invention, the signal paths serve the multiple functions of carrying both data signals and CA signals, and can carry the signals in opposite directions. The memory modules include multi-functional ports which can both receive and output both the data signals and the control signals. As a result, the pin count on the memory modules is reduced over that of the prior art configurations. Accordingly, the memory module, memory device and memory system of the invention is less complex, can be more readily fabricated and occupies less space than those of the prior art.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS OF THE INVENTION

Figure 1:
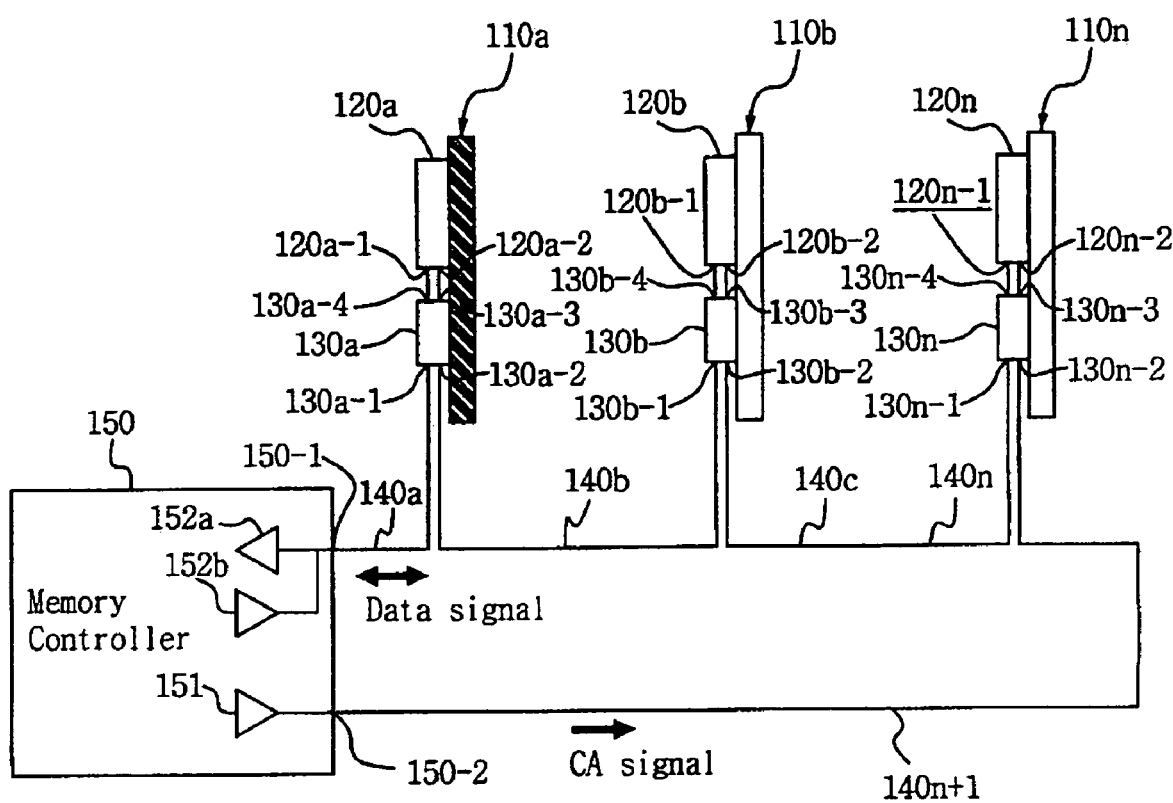
FIG. 1 contains a schematic block diagram of a configuration of a two-way ring topology of a memory system, in accordance with an embodiment of the present invention.

FIG. 1 contains a schematic block diagram of a configuration of a two-way ring topology of a memory system, in accordance with an embodiment of the present invention. The configuration includes a memory controller 150, one or a plurality of memory modules 110a–110n, where n can be any number greater than 1, and signal lines 140a~140n+1. The following description refers to the invention as including a plurality of memory modules. The invention using a single memory module will be understood from the following description. The plurality of memory modules 1110a–110n are connected to one another on the signal lines 140a~140n+1 via daisy-chained buffers 130a~430n.

The signal lines 140a~140n+1 include a plurality of lines. The plurality of lines can be either control (CA) signal lines or DATA signal lines which can include, for example, addressing lines, command lines, and clock lines. In a conventional point-to-point connection, the DATA signal lines and CA signal lines are physically separate lines, in contrast to the configuration of the invention in FIG. 1 in which the signal lines 140a~140n+1 are multi-functional signal lines shared by both the DATA signals and CA signals.

The memory controller 150 is coupled to the first memory module 110a of the plurality of memory modules via the signal line 140a and is coupled to the last memory module 110n via the signal line 140n+1. The memory controller 150 transmits and receives signals at port 150-1 using bi-directional buffers 152a and 152b. The memory controller 150 also transmits signals to port 150-2 using buffer 151.

The first memory module 110a includes a buffer 130a. The signal line 140a is coupled to a first port 130a-1 of the buffer 130a. The buffer 130a is coupled to memory devices or circuits 120a by signal lines from port 130a-3 and 130a-4. The buffer 130a is further coupled by signal lines 140b via a port 130a-2 to a first port 130b-1 of a buffer 130b of memory module 110b. In general, the number of buffers 130a is equal to that of the signal lines in the memory module 110a. Hereinafter, the invention will be described with one buffer only for convenience.

The second memory module 110b includes the buffer 130b. The signal line 140b is coupled to the first port 130b-1 of the buffer 130b. The buffer 130b is coupled to memory devices or circuits 120b by signal lines from port 130b-3 and 130b-4. The buffer 130b is further coupled by signal lines 140c via port 130b-2 to a first port of a buffer of a next memory module (not shown here).

The nth memory module 110n includes the buffer 130n. Signal line 140n is coupled to the first port 130n-1 of the buffer 130n. The buffer 130n is coupled to memory devices 120n by signal lines from port 130n-3 and 130n-4. The buffer is further coupled by signal lines 140n+1 via a port 130n-2 to the memory controller.

To describe operation of the system of FIG. 1, it is assumed that the memory controller 150 issues a WRITE command plus an ADDRESS signal and a DATA signal to the first memory module 110a. The WRITE command and the address signal (hereinafter called CA signal) travel from the second port 150-2 of the controller 150 to the second port 130n-2 of the nth memory module 110n via signal lines 140n+1. The WRITE command includes a module identification portion, such as a bit in a header portion of the command, which specifies the memory module that is to execute the command, i.e., the module that is to write the data. The buffer 130n examines the module identification portion of the command and determines whether the CA signal is intended for the memory module 110n based on the module identification. If the CA signal is for the nth memory module 110n, the CA signal is routed to the memory device 120n via the third port 130n-3 of the buffer 130n. If the CA signal is not intended for the module 120n, the CA signal is output toward the second port 130a-2 of the first module 110a through the daisy-chained buffers, e.g., 130b between the module 110n and the module 110a. These intervening buffers, e.g., 130b each examine the module identification portion of the CA signal to determine if the signal is intended for its respective module 110. If the signal is not intended for an input module, then the signal is output toward the first module 110a on the signal lines 140. If the signal is intended for an input module, 110, then the associated buffer 130 inputs the signal to the module 110.

The DATA signal travels from the first port of the controller 150-1 to the first port 130a-1 of the first memory module 110a via the signal lines 140a. The DATA signal includes a module identification portion, which specifies the module that is to receive the DATA. The daisy-chained buffer 130a examines the module identification portion of the DATA signal and determines whether the DATA signal is intended for its memory module 110a based on the module identification. If the DATA signal is intended for the first memory module 110a, the DATA signal is routed to the memory device 120a via the fourth port 130a-4 of the buffer 130a. If the DATA signal is not intended for the module 110a, the DATA signal is output to the first port 130b-1 of the module 110b.

To further illustrate operation of the system of FIG. 1, it is assumed by way of example, that the memory controller 150 issues a WRITE command plus an ADDRESS signal and DATA signal to the second memory module 110b. The DATA signal travels from the first port 150-1 of the controller 150 to the first port 130a-1 of the first memory module 110a via signal lines 140a. The DATA signal includes a module identification portion, which specifies the module that is to execute the command. The buffer 130a examines the module identification and, because the module identification identifies buffer 130b, the buffer 130a outputs the DATA signal via the second port 130a-2 of the first module 110b to the first port 130b-1 of the second module 110b via the signal lines 140b.

In this example, the CA signal travels from the second port 150-2 of the controller 150 to the second port 130n-2 of the nth memory module 130n via the signal lines 140n+1. The buffer 130n examines the module identification portion of the CA signal to determine if the signal is intended for the module 110n. Because the CA signal is not intended for the module 110n, the CA signal is output toward the second port 130b-2 of the second module 110b through daisy-chained buffers 130n and signal lines 140n and 140c between the modules 110n and 110b.

To further illustrate operation of the configuration of the invention in FIG. 1, it is assumed that the memory controller 150 issues a READ command plus an ADDRESS signal to the second memory module 110b. The READ command and the ADDRESS signal (CA signal) travel from the second port 150-2 of the controller 150 to the second port 130n-2 of the nth memory module 110n via signal lines 140n+1. The READ command includes a module identification portion, which specifies the module that is to execute the command.

The CA signal from the second port 150-2 of the memory controller 150 travels to the second port 130n-2 of the nth module 110n. The CA signal is output to the second port 130b-2 of the second memory module 110b through the daisy chained buffers and signal lines between the module 110n and 110b.

The DATA signal from a memory device 120b travels from a port 120b-1 of the memory device 120b to a first port 150-1 of the memory controller 150 via the buffer 130b. The signal lines between neighboring modules, for example 140b–140n, can be used for both DATA signal lines and CA signal lines while the signal lines between a memory module and the memory controller can be used for DATA signal lines or CA signal lines.

Figure 2:
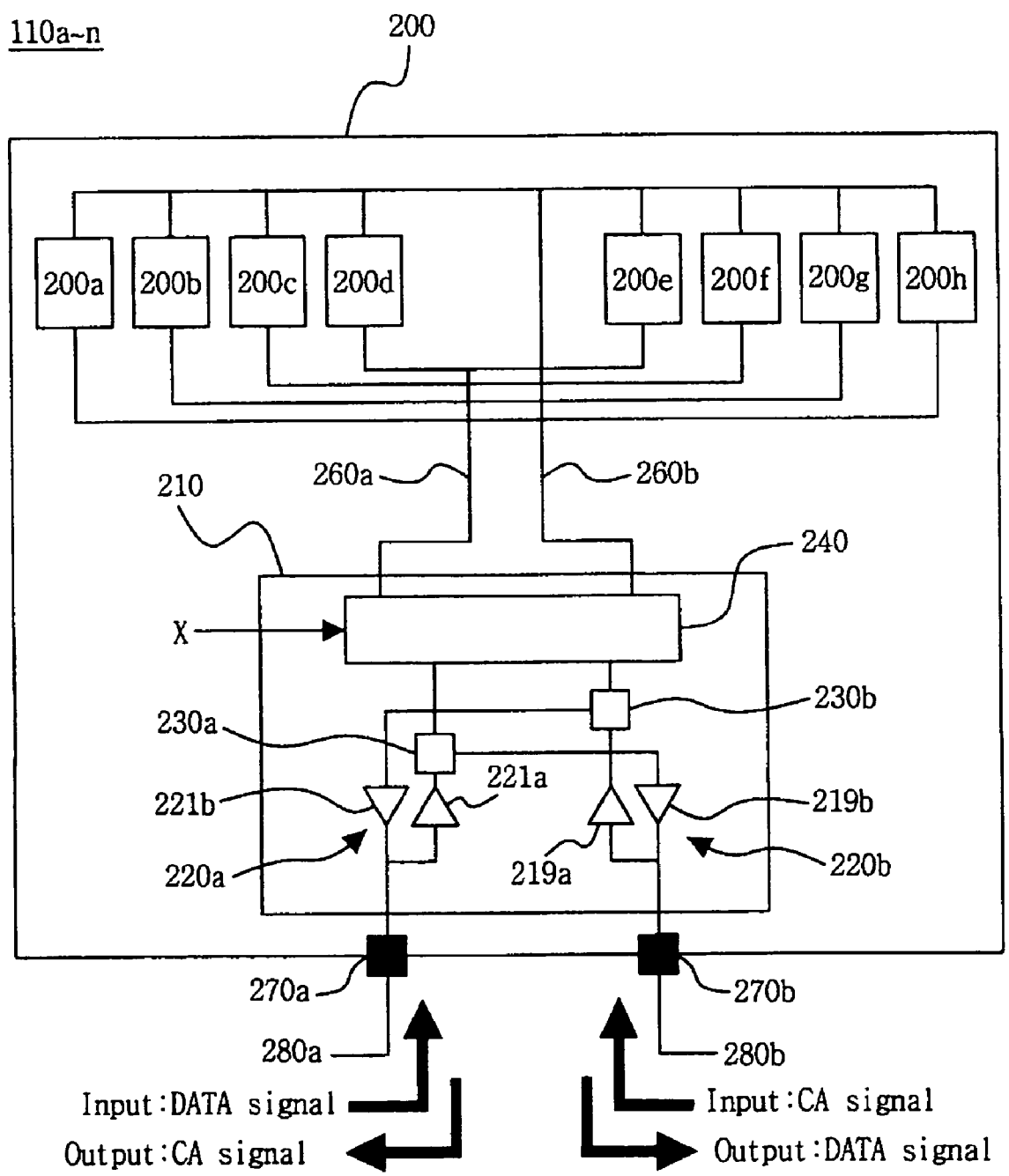
FIG. 2 contains a schematic block diagram of one embodiment of a memory module in accordance with the invention which can be implemented in the two-way ring topology memory system of FIG. 1.

FIG. 2 is a block diagram of one embodiment of a memory module 200 for a two-way ring topology in accordance with the invention. The memory module 200 includes a plurality of memory devices or circuits 200a~200h, buffer circuitry 210 and two ports 270a and 270b. The buffer 210 includes bi-directional drivers 220a and 220b and destination checker circuits 230a and 230b. Each of the two ports 270a and 270b can be either an input port or an output port. The port 270a can be used as an input port for DATA signals and an output port for CA signals. The port 270b can be used as an input port for CA signals and drive an output port for DATA signal.

The first destination checker circuit 230a is coupled to the output of the input buffer 221a of the first bi-directional driver 220a and is coupled to the input of the output buffer 219b of the second bi-directional driver 220b. The first destination checker circuit 230a is further coupled to the synchronization circuit 240. The signal line 280a is coupled to the first port 270a of the module 200. The first port 270a is coupled to the input of the input buffer 221a of the first bi-directional driver 220a. The signal line 280b is coupled to the second port 270b of the module 200. The second port 270b is coupled to the output of the output buffer 219b of the second bi-directional driver 220b.

A DATA signal from the signal line 280a is transmitted to the first destination checker circuit 230a via the first port 270a and the input buffer 221a of the bi-directional driver 220a. The destination checker circuit 230a examines the module identification portion of the DATA signal to determine whether the DATA signal is to be processed by the module 200. The DATA signal is routed to the synchronization circuit 240 if it is determined that the DATA signal is to be processed by the module 200. The DATA signal is routed to the input of output driver 219b of the second bi-directional driver 220b if it is determined that the DATA signal is not to be processed by the module 200. That is, the DATA signal is routed depending on the determination of the module identification for the DATA signal made by the first destination checker circuit 230a. For example, the DATA signal is routed to the synchronization circuit 240 when the module identification matches that of the module, and the DATA signal is routed to the input of the output driver 219b of the second bi-directional driver 220b when the module identification mismatches. The non-matching DATA signal is output to the signal line 280b by the output driver 219b of the second bi-directional driver 220b. In this case, the first port 270a is an input port for the DATA signal, and the second port 270b is an output port for the un-matched DATA signal.

The CA signal from the signal line 280b is transmitted to the second destination checker circuit 230b via the second port 270b and the input buffer 219a of the second bi-directional driver 220b. The destination checker circuit 230b examines the module identification portion of the CA signal to determine whether the CA signal is to be processed by the module 200. The CA signal is routed to the synchronization circuit 240 if it is determined that the CA signal is to be processed by the module 200. The CA signal is routed to the input of output driver 221b of the first bi-directional driver 220a if it is determined that the CA signal is not to be processed by the module 200. That is, the CA signal is routed to either the synchronization circuit 240 or the input of output driver 221b of the first bi-directional driver 220a depending on the determination of the module identification for the CA signal made by the second destination checker 230b. For example, the CA signal is routed to the synchronization circuit 240 when the module identification of the CA signal matches that of the module, and the CA signal is routed to the input of output driver 221b of the second bi-directional driver 220a when the module identification mismatches. The un-matched CA signal is output to the signal line 280a by the output driver 221b of the first bi-directional driver 220a. In this case, the first port 270a is an output port for the un-matched CA signal, and the second port 270b is an input port for the matched CA signal.

The synchronization circuit 240 controls a timing relationship between the DATA signal and the CA signal. The arrival time to a targeted module 200 of the DATA signal and the CA signal is generally different because the signals travel along different paths and in different directions. The relationship between the timing of the signals is known by the controller 150. The control signal X from the controller 150 sets the synchronization circuit 240 according to the known delay. The synchronization circuit 240 sends the synchronized CA signal and DATA signal to the plurality of memory circuits or devices 200a~200h via the signal lines 260a and 260b. In another approach, the controller 150 can execute the role of the synchronization circuit 240 so that the synchronization circuit can be omitted from the module configuration. In this alternative approach, the controller 150 synchronizes the signals such that they are processed by the module 200 in synchronization.

Figure 3:
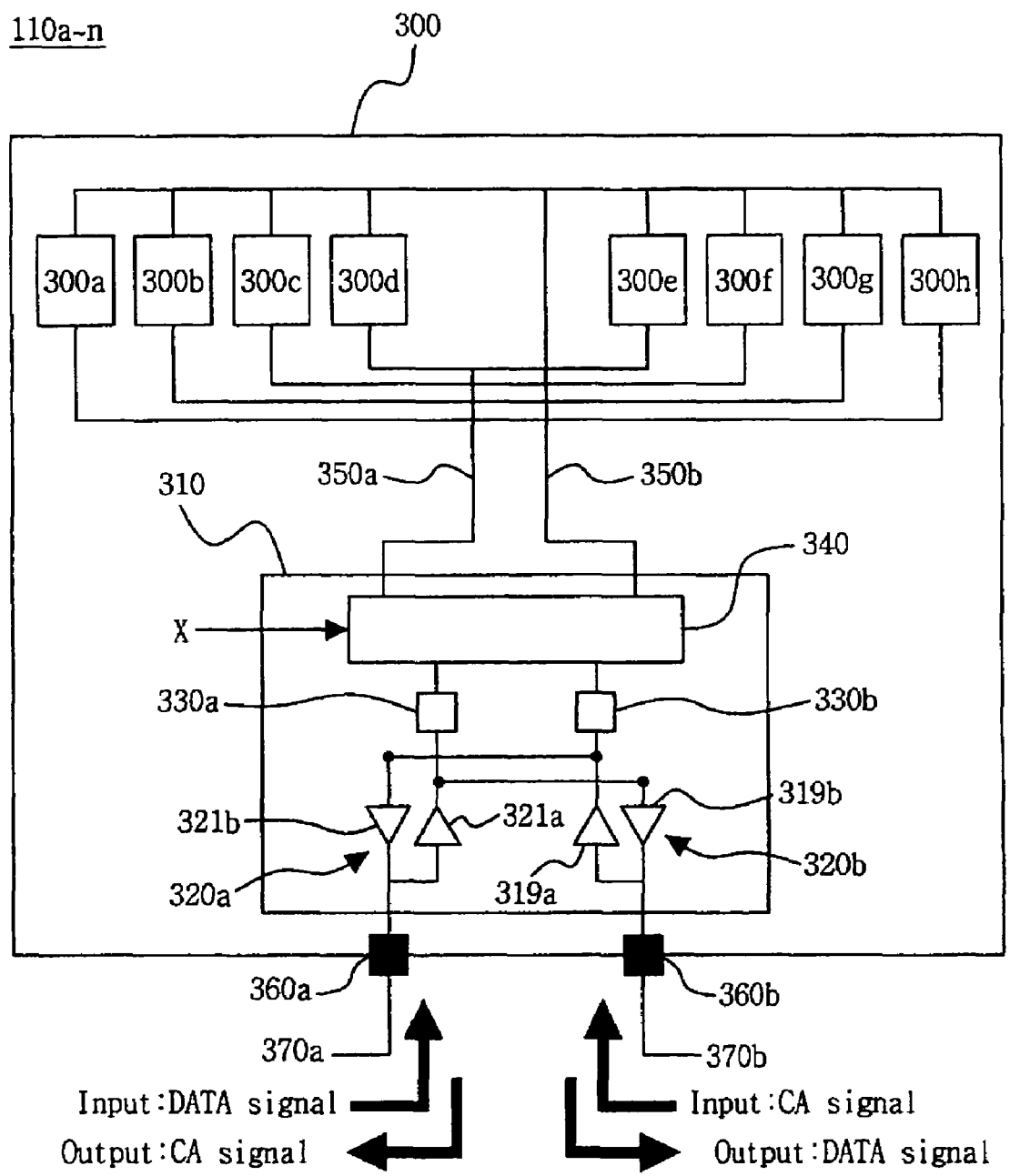
FIG. 3 contains a schematic block diagram of another embodiment of a memory module in accordance with the invention which can be implemented in the two-way ring topology memory system of FIG. 1.

FIG. 3 is a block diagram of another embodiment of a memory module 300 for a two-way ring topology in accordance with the invention. The difference between the module 200 of FIG. 2 and the module 300 of FIG. 3 is that in the module 300 of FIG. 3, input signals are not output via the destination checker circuits 330a and 330b.

Referring to FIG. 3, the DATA signal from the signal line 370a is transmitted to the first destination checker circuit 330a via the first port 360a and the input buffer 321a of the first bi-directional driver 320a. The DATA signal is further transmitted to the output buffer 319b of the second bi-directional driver 320b. In this case, the DATA signal is not transmitted to the output buffer 319b via the first destination checker circuit 330a. The destination checker circuit 330a determines whether to pass the DATA signal to the synchronization circuit 340 based on the module identification portion of the DATA signal.

The CA signal from the signal lines 370b is transmitted to the second destination checker circuit 330b via the second port 360b and the input buffer 319a of the second bi-directional driver 320b. The C the first bi-directional driver 320a. In this case, the CA signal is not transmitted to the output buffer 321b via the first destination checker circuit 330b. The destination checker circuit 330b determines whether to pass the CA signal to the synchronization circuit 340 based on the module identification portion of the CA signal.

Figure 4:
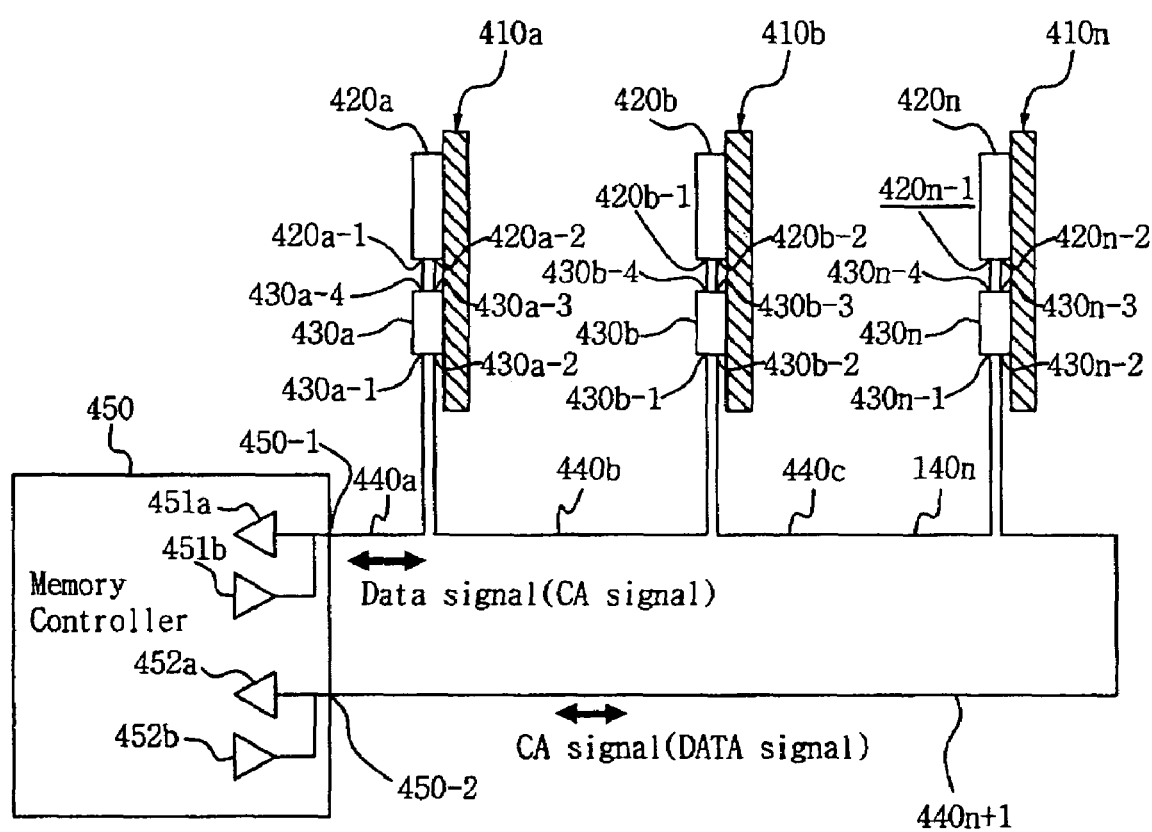
FIG. 4 contains a schematic block diagram of another configuration of a two-way ring topology of a memory system, in accordance with another embodiment of the present invention.

FIG. 4 contains a block diagram of another configuration of a two-way ring topology of a memory system in accordance with the present invention. The configuration includes a memory controller 450, a plurality of memory modules 410a–410n, where n can be any number greater than 1, and signal lines 440a~440n+1. The plurality of memory modules 410a–410n are connected to one another on the signal lines via daisy-chained buffers 430a~430n.

The characteristics of this embodiment are that the two ports of memory controller 450-1 and 450-2 can be used for either DATA signals or CA signals. In this embodiment, the memory controller 450 includes bi-directional drivers at both ports 450-1 and 450-2. The bi-directional ports 450-1 and 450-2 are implemented using buffers 451a, 451b, 452a and 452b as shown. In the first configuration of FIG. 1, the direction of DATA signals is clockwise, while the direction of CA signals is counterclockwise. However, in the configuration of FIG. 4, the direction of both DATA signals and CA signals can be either clockwise or counterclockwise, according to the controller 450.

In this embodiment, when the direction of DATA signals is clockwise, the direction of CA signals is counterclockwise. When the direction of DATA signals is counterclockwise, the direction of CA signals is clockwise. But, in a READ case, it may be in the same direction.

Figure 5:
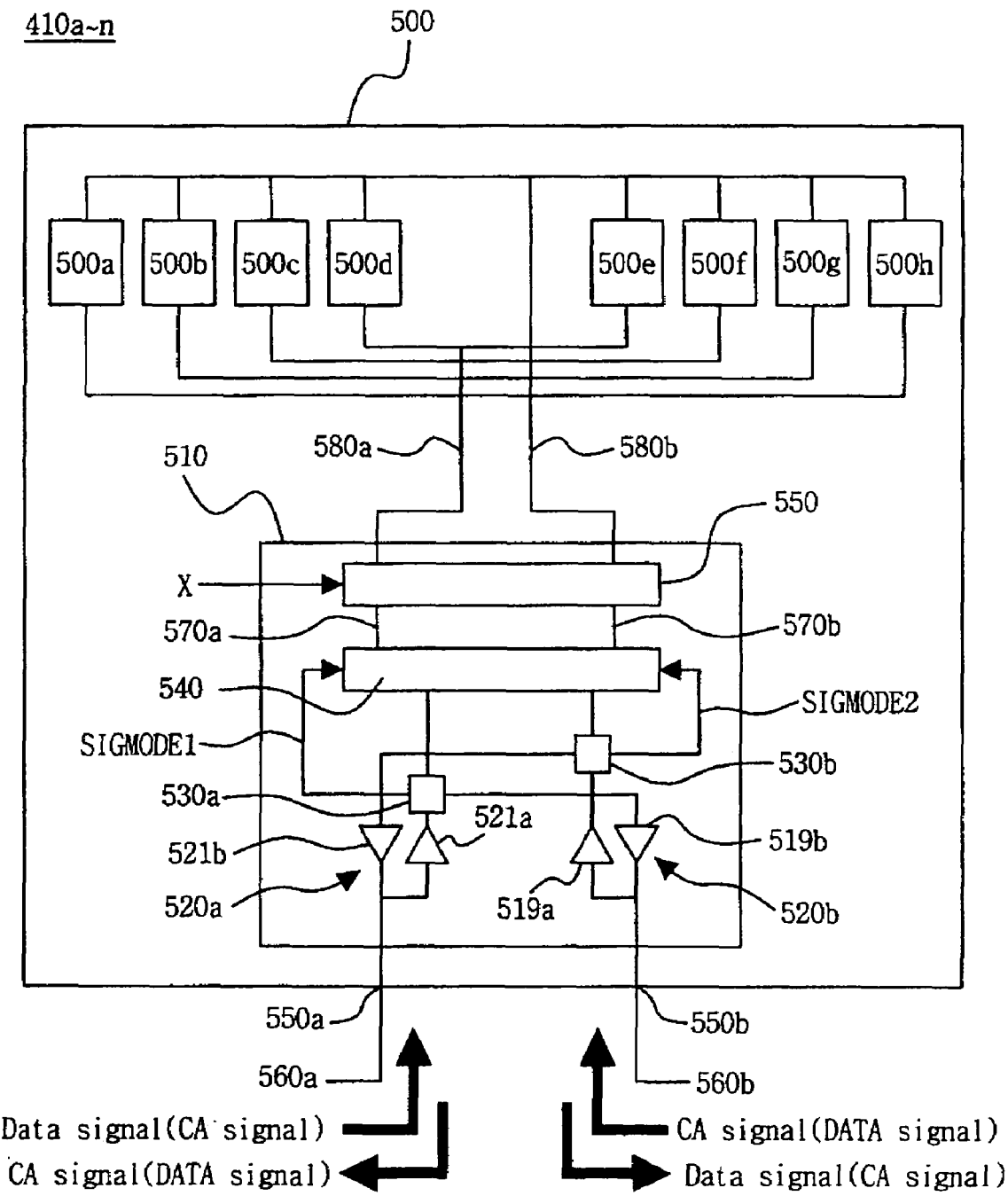
FIG. 5 contains a schematic block diagram of another embodiment of a memory module in accordance with the invention which can be implemented in the two-way ring topology memory system of FIG. 4.

FIG. 5 contains a schematic block diagram of another embodiment of a memory module in accordance with the invention which can be implemented in the two-way ring topology of FIG. 4. In this embodiment, the memory module 500 includes a plurality of memory devices or circuits 500a~500h, buffer circuitry 510 and two ports 550a and 550b. The buffer circuitry 510 includes bi-directional drivers 520a and 520b, destination checker circuits 530a and 530b, a router circuit 540 and a synchronization circuit 550. The port 550a can be an input and output port for DATA signals and CA signals, respectively. The port 550b can be an input and output port for DATA signals and CA signals, respectively.

The first destination checker circuit 530a is coupled to the output of the input buffer 521a of the first bi-directional driver 520a and is coupled to the input of the output buffer 519b of the second bi-directional driver 520b. The first destination checker circuit 530a is further coupled to the router circuit 540. The signal line 560a is coupled to the first port 550a of the module 500. The first port 550a is coupled to the input of the input buffer 521a of the first bi-directional driver 520a. The signal line 560b is coupled to the second port 550b of the module 500. The second port is coupled to the output of the output buffer 519b of the second bi-directional driver 520b.

Either DATA signals or CA signals can be input to the port 550a. If a DATA signal is input to the port 550a, a CA signal is input to the port 550b. If a CA signal is input to the port 550a, a DATA signal is bi-directionally transmitted to the port 550b. To illustrate by way of example, a signal is received on signal line 560a and is transmitted to the first destination checker circuit 530a via the first port 550a and the input buffer 521 a of the first bi-directional driver 520a. The destination checker 530a examines the module identification portion of the signal to determine whether the signal is to be processed by the module 500. The signal is also examined by the destination checker circuit 530a to determine a signal mode of the signal, that is, whether the signal is a DATA signal or a CA signal. The signal is routed to either the router 540 or the input of output buffer 519b of the second bi-directional driver 520b based on the module identification of the signal. The signal is routed to the router circuit 540 when the module identification of the signal matches that of the module 500. An un-matched signal is output to the signal lines 560b by the output buffer 519b of the second bi-directional driver 520b. If the signal is a match, it is passed to the router circuit 540 by the destination checker circuit 530a. The router circuit 540 determines where the matched signal is then routed, based on whether the signal is a DATA signal or a CA signal. The destination checker circuit 530a generates a signal SIGMODE1 which identifies the signal mode of the signal, i.e., it identifies whether the signal is a DATA signal or a CA signal. When the signal mode SIGMODE1 identifies the signal as a DATA signal, the signal is routed to the signal lines 570a by the router circuit 540. When the signal mode signal SIGMODE1 identifies the signal as a CA signal, the signal is routed to the signal lines 570b by the router circuit 540. In this case, i.e., when a signal is received on port 550a, the router circuit 540 is controlled by the SIGMODE1 signal generated by the destination checker circuit 530a.

A signal from the signal lines 560b is transmitted to the second destination checker circuit 530b by the second port 550b and the input buffer 519a of the second bi-directional driver 520b. The signal is routed to either the router circuit 540 or the input of output buffer 521b of the first bi-directional driver 520a based on the module identification of the signal. The signal is routed to the router circuit 540 when the module identification matches that of the module. An un-matched signal is output to the signal lines 560 a by the output buffer 521b of the first bi-directional driver 520a. The router circuit 540 determines the routing of a matched signal based on the mode of the signal, i.e., whether the signal is a DATA signal or a CA signal. The destination checker circuit 530b generates the signal mode signal SIGMODE2 to identify the mode of the signal and transmits the signal SIGMODE2 to the router circuit 540. When the signal mode signal SIGMODE2 identifies the signal as a DATA signal, the signal is routed to the signal lines 570a by the router circuit 540. When the signal mode signal SIGMODE2 identifies the signal as a CA signal, the signal is routed to the signal lines 570b by the router circuit 540. That is, the router circuit 540 is controlled by the SIGMODE2 signal generated by the destination checker 530b.

The synchronization circuit 550 controls a timing relationship between DATA signals and CA signals. The timing relationship between them is dependent upon the module identification. Accordingly, the timing relationship is known by the memory controller. The control signal X from the controller sets the synchronization circuit 550. The synchronization circuit 550 transmits the CA signal and the DATA signal to the plurality of memories via the signal lines 580*a* and 580*b*. It should be noted that the functionality of the synchronization circuit can be implemented in the controller. In that case, the synchronization circuit can be omitted.

Figure 6:
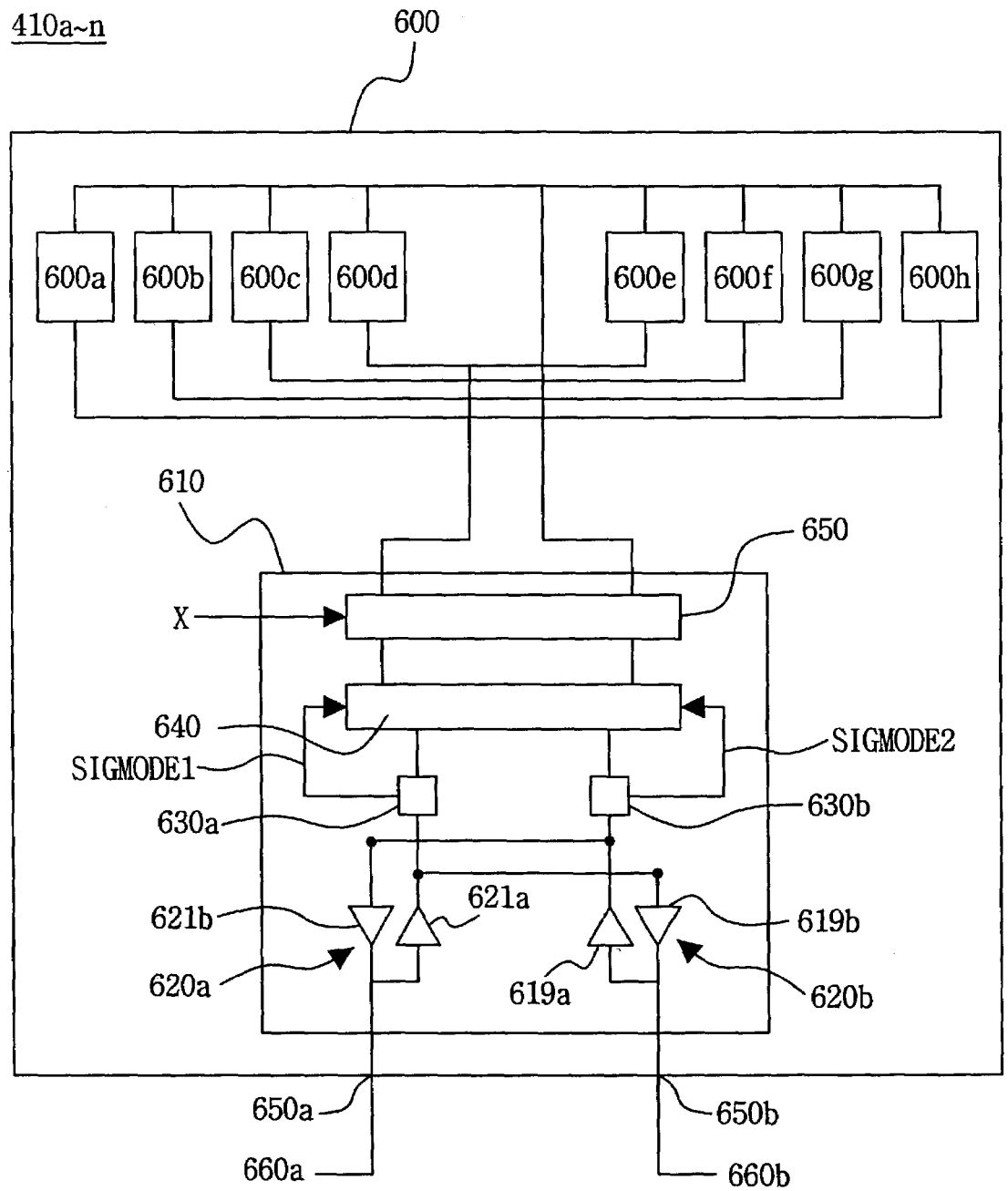
FIG. 6 contains a schematic block diagram of another embodiment of a memory module in accordance with the invention which can be implemented in the two-way ring topology memory system of FIG. 4.

FIG. 6 contains a schematic block diagram of another embodiment of a memory module 600 which can be used in the two-way ring topology memory system of FIG. 4. The difference between FIG. 5 and FIG. 6 lies in the destination checker circuits 630*a* and 630*b*. In the embodiment of FIG. 6, the signal from the signal lines 660*a* is transmitted to the first destination checker circuit 630*a* via the first port 650*a* and the input buffer 621*a* of the first bi-directional driver 620*a*. The signal is further transmitted to the output buffer 619*b* of the second bi-directional driver 620*b*. The signal is not transmitted to the output buffer 619*b* via the first destination checker 630*a*. The destination checker circuit 630*a* determines whether it passes the signal based on the module identification. The same functional configuration also applies for port 650*b* and destination checker circuit 630*b*.

Figure 7:
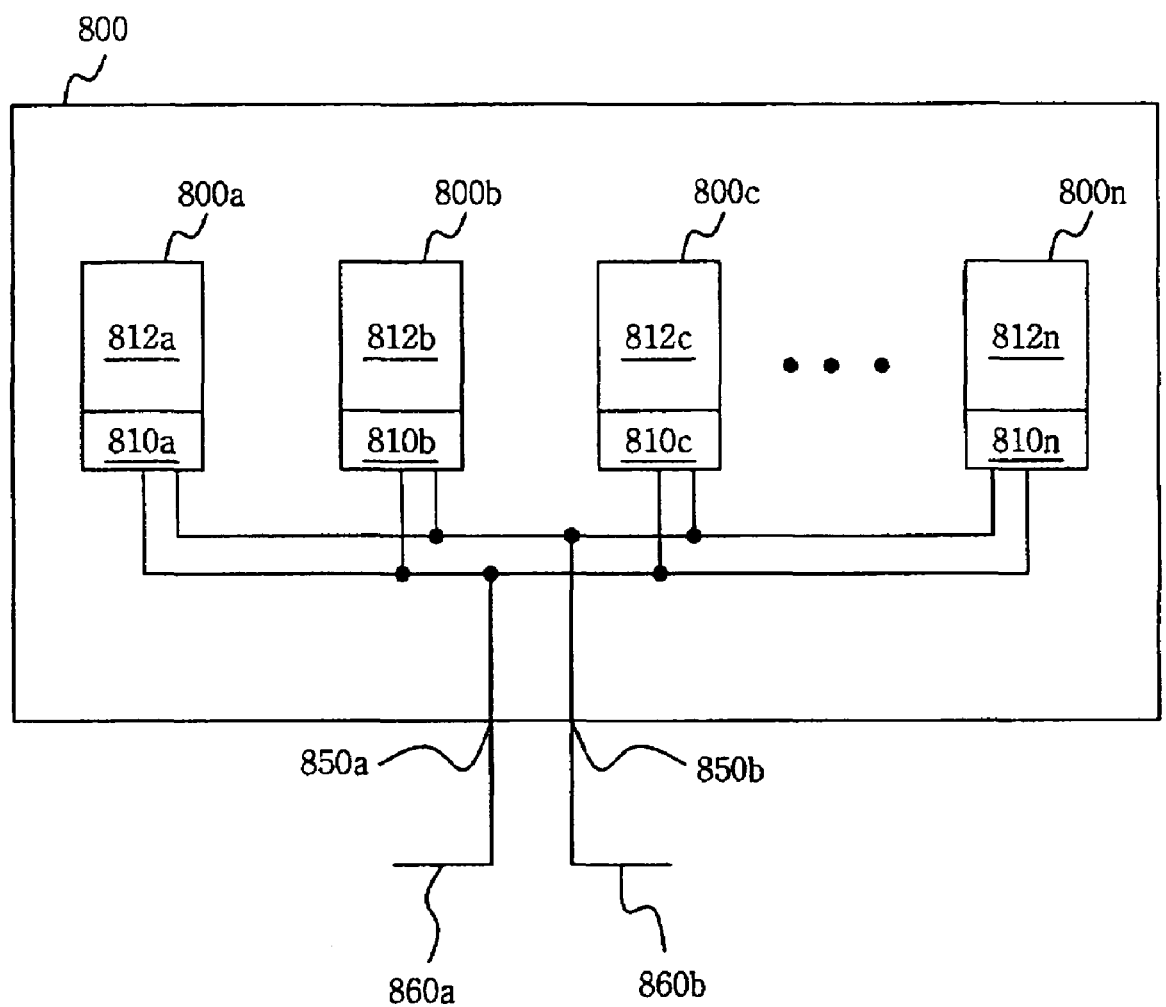
FIG. 7 contains a schematic block diagram of a memory module, in accordance with another embodiment of the invention, which is applicable to all of the memory systems described herein.

FIG. 7 contains a schematic block diagram of a memory module 800, in accordance with another embodiment of the invention, which is applicable to all of the memory systems described herein. Referring to FIG. 7, in this embodiment, the buffer circuitry described herein above in connection with the previous embodiments, is implemented on the individual memory devices 800*a*~800*h* themselves, rather than being separate circuitry on the module.

Referring to FIG. 7, the memory module 800 includes individual memory circuits or devices 800*a*~800*h*. Each of the devices 800*a*~800*h* includes a memory or storage portion or circuit 812*a*~812*h* and a buffer circuitry portion 810*a*~810*h*. The buffer circuitry portion 810*a*–810*h* is configured in similar fashion to any of the buffer circuitry configurations described above in connection with the various embodiments of the invention and implements the same functionality as any of the embodiments described above.

It should be noted that in all of the embodiments of memory modules described herein, the memory modules are described as including eight memory circuits or devices. It will be understood that the invention is applicable to any number of memory circuits per module.

While this invention has been particularly shown and described with references to preferred embodiments thereof, it will be understood by those skilled in the art that various changes in form and details may be made therein without departing from the spirit and scope of the invention as defined by the appended claims.

The invention claimed is:

1. A memory system, comprising:
    a signal path shared by command and address (CA) signals and data signals;
    a memory controller transmitting the CA signals without the data signals at a first end of the signal path in a first direction along the signal path and transmitting the data signals without the CA signals at a second end of the signal path in a direction opposite to the first direction along the signal path; and
    at least one memory module, the memory modules and the memory controller being connected by the signal path in a closed-loop configuration.

2. The memory system of claim 1, wherein the signal path comprises a plurality of signal lines, wherein the quantity of signal lines is M if M is greater than N and the quantity of signal lines is N if N is greater than M, wherein M is the number of CA signals and N is the number of data signals.

3. The memory system of claim 1, wherein the CA signals are output by a first port of the memory controller on the signal path, and the data signals are transmitted by a second port of the memory controller on the signal path.

4. The memory system of claim 1, wherein one of the CA signals and data signals is output by a first port of the memory controller at the first end of the signal path, and the other of the data signals and CA signals is output by a second port of the memory controller at the second end of the signal path.

5. The memory system of claim 1, wherein the memory modules comprise first and second ports for receiving the CA signals and data signals.

6. The memory system of claim 5, wherein the ports are multi-functional ports which can output the CA signals and receive the data signals or can output tile data signals and receive the CA signals.

7. The memory system of claim 6, wherein a first port of a memory module is an input port and an output port for the data signals and the CA signals, respectively.

8. The memory system of claim 7, wherein a second port of a memory module is an input port and an output port for the CA signals and the data signals, respectively.

9. The memory system of claim 5, wherein each memory module comprises a destination circuit for determining whether a received signal is intended to be processed by a memory device on the memory module.

10. The memory system of claim 9, wherein each memory module comprises an output buffer for outputting a received signal to the signal path if it is determined that die received signal is not intended to be processed by a memory device on the memory module.

11. The memory system of claim 1, wherein each memory module comprises a synchronization circuit for compensating for a delay of a received signal on the signal path.

12. The memory system of claim 1, wherein each memory module comprises a destination circuit for determining whether a received signal is a CA signal or a data signal.

13. The memory system of claim 12, wherein the destination circuit generates a signal mode signal indicative of whether the received signal is a data signal or a CA signal.

14. The memory system of claim 1, wherein each memory module comprises a router circuit for routing a received signal identified as a data signal to a memory device of the memory module on a data signal line and for routing a received signal identified as a CA signal to the memory device on a CA signal line.

15. A memory system, comprising:
    a signal path shared by command and address (CA) signals and data signals;
    a memory controller executing:
        one of transmitting the CA signals without the data signals in a first direction and transmitting the data signals without the CA signals in the first direction at a first end of the signal path, and the other of transmitting the CA signals without the data signals in a second direction opposite to the first direction and transmitting the data signals without the CA signals in the second direction opposite to the first direction at a second end of the signal path; and
    a memory module having at least one memory device, the memory module and the memory controller being connected by the signal path in a closed-loop configuration.

16. The memory system of claim 9, wherein each memory module sends the received signal to the memory device if it is determined that the received signal is intended to be processed by the memory device on the memory module.

17. The memory system of claim 9, wherein each memory module sends the received signal to the memory device and outputs the data signal of the memory device to the second port if it is determined that the CA signal received to the first port is intended to be processed by the memory device on the memory module.

* * * * *

UNITED STATES PATENT AND TRADEMARK OFFICE
CERTIFICATE OF CORRECTION

PATENT NO.        : 7,093,076 B2                                       Page 1 of 1
APPLICATION NO.   : 10/347733
DATED             : August 15, 2006
INVENTOR(S)       : Kyung It is certified that error appears in the above-identified patent and that said Letters Patent is hereby corrected as shown below:

Column 10, Line 18, delete "tile" and insert --the-- between "output" and "data".

Column 10, Line 32, delete "die" and insert --the-- between "that" and "received".

Signed and Sealed this

Twelfth Day of December, 2006

JON W. DUDAS
*Director of the United States Patent and Trademark Office*